(12) United States Patent
Shiraishi et al.

(10) Patent No.: US 7,070,113 B2
(45) Date of Patent: Jul. 4, 2006

(54) NONVOLATILE MEMORY CARD

(75) Inventors: Atsushi Shiraishi, Kodaira (JP); Takayuki Tamura, Higashiyamato (JP); Chiaki Kumahara, Kodaira (JP); Shinsuke Asari, Akishima (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 112 days.

(21) Appl. No.: 10/667,663

(22) Filed: Sep. 23, 2003

(65) Prior Publication Data
US 2004/0065744 A1  Apr. 8, 2004

(30) Foreign Application Priority Data
Oct. 7, 2002  (JP)  ............................ 2002-294060

(51) Int. Cl.
*G06K 19/06* (2006.01)
(52) U.S. Cl. ..................................................... 235/492
(58) Field of Classification Search ................ 235/492, 235/375, 441, 493, 486, 487; 365/185.11, 365/185.33; 707/100, 200, 2
See application file for complete search history.

(56) References Cited

U.S. PATENT DOCUMENTS

| | | | |
|---|---|---|---|
| 5,138,696 A * | 8/1992 | Nagata | 358/1.11 |
| 5,644,539 A | 7/1997 | Yamagami et al. | 365/200 |
| 6,151,247 A * | 11/2000 | Estakhri et al. | 365/185.11 |
| 6,606,628 B1 * | 8/2003 | Monsen et al. | 707/100 |
| 2004/0019784 A1 * | 1/2004 | Monsen et al. | 713/165 |
| 2004/0065744 A1 * | 4/2004 | Shiraishi et al. | 235/492 |

FOREIGN PATENT DOCUMENTS

| | | |
|---|---|---|
| JP | H06-124596 | 5/1994 |
| JP | 5-204561 | 8/2003 |

* cited by examiner

Primary Examiner—Thien M. Le
(74) Attorney, Agent, or Firm—Miles & Stockbridge P.C.

(57) ABSTRACT

A nonvolatile memory has an erase table in which a free-space information flag is associated with each physical address of a memory area and an address translation table in which a physical address of a memory area is associated with each logical address. The free-space information flag indicates whether a corresponding memory area is permitted to be erased. A control circuit determines a memory area to which rewrite data is to be written by referring to the free-space information flag, reflects the physical address and the logical address of the memory area to which the data is written into the address translation table, and updates the free-space information flag. The memory area to which rewrite data is to be written is determined by referring to the free-space information flag, and rewriting is not performed in the same memory area.

17 Claims, 13 Drawing Sheets

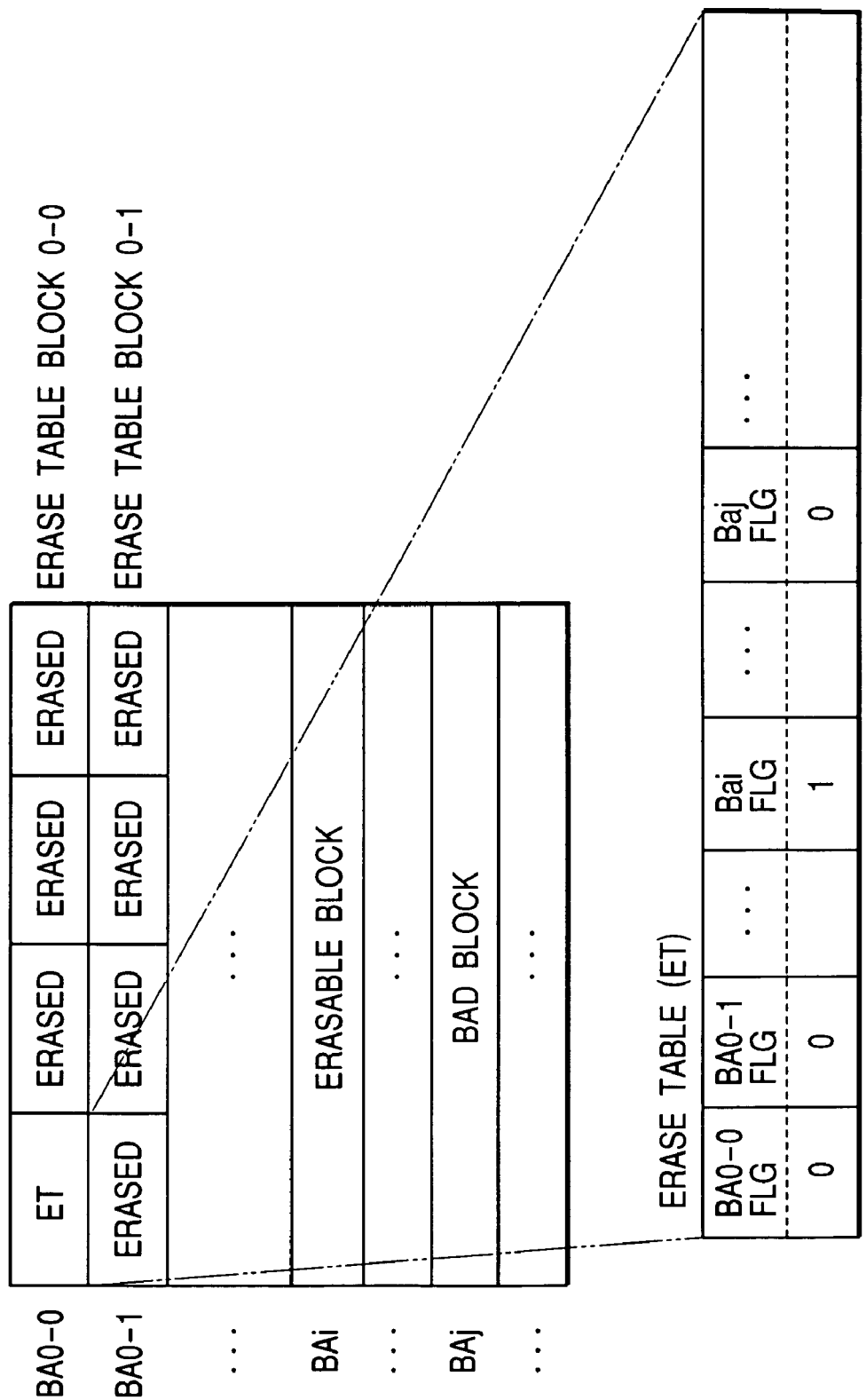

TABLE UPDATE

NONVOLATILE MEMORY CARD

BACKGROUND OF THE INVENTION

The present invention relates to a memory card having an erasable programmable nonvolatile memory such as a flash memory and, more particularly, to improvements in a technique of dynamically assigning a physical address of a memory area in association with a logical address.

When a write error or the like occurs in a memory card, an error block is replaced with a spare memory block. In such a replacing technique, a spare area management table is provided. When a sector validity flag provided for a sector management area in a memory block unit such as a sector indicates an "invalid state", a spare sector address is obtained from the spare area management table. With respect to a sector of the spare sector address, similarly, the sector management area is read and its validity is determined. If the area is invalid, a spare sector address is similarly obtained from the spare area management table.

A patent document 1 (described later) discloses a configuration in which a data memory area for storing file data, a spare memory area for replacing an error area, and an error memory area for storing error information of the data memory area are provided in a flash memory mounted on a memory card, and the address of a spare memory of a data memory having an error is stored into the error memory area (refer to FIG. 2).

A patent document 2 (described later) discloses a technique in which, at the time of writing data, in a manner similar to an optical disk, storage data and a storage location are not associated with each other. When data is written, the data is added. In the case of rewriting a file already written, the storage area of the old file is invalidated to an erasable area and garbage collection for erasing data in the invalid area is performed at a certain timing (refer to the fourth and eighth columns). In this technique, for file management, a logical sector table, a physical sector table, and a status table are used. By using the logical sector table, a location in a flash memory in which data of a logic sector is mapped can be referred to. By the physical sector table, the logical sector number of file data mapped to a physical sector can be referred to. By the status table, the status of each physical sector can be referred to. For example, in writing operation, a write pointer showing a sector to which the next data is to be written is set, and whether the sector indicated by the pointer is in a writable state or not can be determined by referring to the status table. In the status table, a flag indicative of deterioration due to a large number of erasing times and a flag indicating that data is already written exist. When any of the flags is set and data cannot be written, a control of moving the pointer to the next sector is executed.

Patent Document 1

Japanese Unexamined Patent Publication No. Hei 5(1993)-204561 (U.S. Pat. No. 5,644,539)

Patent Document 2

Japanese Unexamined Patent Publication No. Hei 6(1994)-124596

SUMMARY OF THE INVENTION

In the conventional techniques, however, to retrieve a spare area at the time of writing or rewriting, a process of sequentially reading management information of a physical sector or a process of reading the address or the like of a spare memory from the error memory area has to be performed. Also in the technique in which storage data and a storage location are not associated with each other, status information of a status table has to be sequentially read in accordance with the value of a pointer for designating a sector to which data is to be written. In short, to retrieve a free sector to which data is to be written, a process of sequentially read information from a physical sector is necessary.

The inventor herein has studied and found that when an operation power source is shut down during erasing operation, there is the possibility that a write block, for example, address information of a sector is lost or data other than data to be written is lost undesirably. Specifically, at the time of writing data, a nonvolatile memory such as a flash memory capable of erasing/writing data erases data and then performs a process of writing data. In one block as a unit of the erasing/writing process, not only user data but also management information such as a code indicating whether the block is bad or good and the logical address of the block is included. In the erasing/writing process, information stored in a block to be processed is saved into a buffer and, in this state, erasing operation is performed. After that, management information is sequentially written together with rewrite data into a corresponding block. If the operation power source is shut down during the erasing process, the management information on the buffer is also lost and the address of the block dissipates. Also in the case where data of a size smaller than one block is rewritten, data of the block including data which is not rewritten on the block is similarly saved since the operation is performed on the unit basis of the erasing/writing process, and the erasing operation is performed on the block unit basis. After that, the data to be rewritten and the data to be not rewritten, which has been saved is written into the block. If the operation power source is shut down during the erasing/writing operation, the data which is not rewritten on the buffer also dissipates and the data which is not to be rewritten is also lost undesirably. The shutdown of the operation power source occurs, for example, when the memory card is taken out from a memory slot or when the power of a card host is turned off.

An object of the invention is to provide a memory card capable of realizing an access to a normal memory area at a higher speed.

Another object of the invention is to provide a memory card having life longer than limitation of the number of rewriting times of memory cells and capable of reducing an influence of disturbance by erasing/writing process.

Further another object of the invention is to provide a memory card capable of preventing loss of an address and undesired loss of stored information which is not to be rewritten even when the operation power source is interrupted during erasing/writing process.

The above and other objects and novel features of the invention will become apparent from the following description of the specification and the appended drawings.

An outline of representative inventions of inventions disclosed in the specification will be briefly described as follows.

[1] A memory card has an erasable programmable nonvolatile memory (2) and a control circuit (5). A memory array of the nonvolatile memory has an erase table in which a free-space information flag (FLG) is associated with each physical address of a memory area, and the free-space information flag has a first status indicating that the corresponding memory area is permitted to be erased and a second status indicating that the corresponding memory area is inhibited to be erased. The control circuit refers to the erase table for search of a memory area to which rewrite data is written. Therefore, at the time of rewriting data, when the free-space information flag in the first status is identified by referring to the erase table, the memory area of the physical address according to the free-space information flag of the first status is set as an object of erase/rewriting. Since the rewriting is not performed in the same memory area as that before the rewriting, even if the rewriting is performed, the original storage information remains in the memory area.

[2] A memory card has an erasable programmable nonvolatile memory and a control circuit. The nonvolatile memory has, in a part of a memory array, an erase table in which a free-space information flag is associated with each physical address of a memory area. The free-space information flag has a first status indicating that the corresponding memory area is permitted to be erased and a second status indicating that the corresponding memory area is inhibited to be erased. The control circuit uses a physical address according to the free-space information flag in the first status obtained by searching the erase table as a memory area to which rewrite data is written.

[3] A memory card has an erasable programmable nonvolatile memory and a control circuit. A memory array of the nonvolatile memory has an erase table in which a free-space information flag is associated with each physical address of a memory area and an address translation table in which a physical address of a memory area is associated with each logical address, and the free-space information flag indicates whether a corresponding memory area is permitted to be erased or not. The control circuit determines a memory area to which rewrite data is written by referring to the free-space information flag of the erase table, updates the address translation table by associating the physical address of the memory area in which the data is written with the logical address and updates the free-space information flag of the erase table.

Since the correspondence between the physical address and the logical address of a memory area can be directly changed by the address translation table, by constructing the address translation table so as to exclude a memory area having an error, it becomes unnecessary to find a spare used for the error, so that a higher-speed access can be realized. In rewriting of storage information, the memory area to which rewrite data is written is determined by referring to the free-space information flag of the erase table, and the rewriting is not performed in the same memory area. Therefore, even if rewriting is performed, the original storage information remains in the memory area before the rewriting. Since the correspondence between the physical address and the logical address and the free state of the memory area which change by rewriting are reflected in the address translation table and the erase table after the rewriting is performed, even if the power is shut down during the rewriting process, significant storage information can be maintained as it is while maintaining an accessible state.

As a concrete form of the invention, the erase table is arranged so as to be divided into a plurality of memory areas having different erase units, and an erase table (first erase table) which is referred to when a memory area to which rewrite data is written is determined is selected by using a random number. The reason why a random number is used is to prevent the rewriting process from being concentrated in the same memory area.

The processes of updating the free-space information flag of the erase table are a first updating process of setting the free-space information flag corresponding to a memory area determined as a memory area to which rewrite data is to be written into an erase inhibited status for an erase table referred to when a memory area to which rewrite data is written is determined, and a second updating process of setting the free-space information flag to an erase permitted status in an erase table having the free-space information flag according to the memory area in which the rewrite data is held. By the process, the free-space information flags in the first and second erase tables are matched with an actual state.

Particularly, it is desirable to perform the first updating process and, after that, the second updating process. It is desirable to perform a process of updating an address translation table by associating a physical address and a logical address of a memory area to which the data has been written with each other between the first and second updating processes. The order of the processes has a meaning of surely preventing loss of data due to an undesired shutdown of the power source and a meaning of facilitating matching of the logic of the storage information management. Specifically, a process of protecting the data of a new block address by inhibiting the data to be erased (second updating process) is performed. After that, a process of preventing data remaining in an old block address from being easily taken (address translation table updating process) and a process of permitting the data remaining in the old block address to be erased (first updating process) are performed. If the second updating process is completed first, a state in which both of the new and old block addresses are permitted to be erased occurs. When the power source is shut down in such a state, the state in which the erase is permitted on both the old and new block addresses is maintained and there is the possibility that necessary data is undesirably erased.

As another concrete form of the invention, the erase table disposed so as to be divided into a plurality of memory areas having different erase units is multiplexed on the memory areas having different erase units, and the multiplexed erase tables are sequentially updated and used so as to alternately change the erase unit. By the multiplexing, the frequency of repeatedly rewriting the same nonvolatile memory cell can be reduced.

Similarly, it is also desirable to arrange the address translation table so as to be divided into a plurality of memory areas having different erase units. The address translation table arranged so as to be divided is multiplexed on the memory areas of different erase units, and the multiplexed address translation tables are sequentially updated so as to alternately change the erase unit.

As further another concrete form of the invention, the control circuit searches the address translation table for a memory area from which data is read. The erase unit of the nonvolatile memory is larger than a write unit instructed from the outside.

[4] A memory card according to another aspect of the invention has an erasable programmable nonvolatile memory and a control circuit. A memory array of the nonvolatile memory has an erase table in which a free-space information flag is associated with each physical address of a memory area and an address translation table in which a physical address of a memory area is associated with each logical address, the free-space information flag indicates whether the corresponding memory area is permitted to be erased or not. At the time of rewriting storage information, the control circuit reads an address translation table corresponding to a logical address to which storage information is to be rewritten into a buffer, obtains a physical address of rewrite data from the read address translation table, reads a memory area of the obtained physical address, stores the read data into the buffer, reads a first erase table corresponding to the obtained physical address into the buffer, reads a second erase table used to retrieve a memory area to which rewrite data is written into the buffer, determines a memory area to which rewrite data is written by referring to a free-space information flag of the read second erase table, combines the stored data with data which is input from the outside, writes the combined data as rewrite data into the determined memory area, updates a correspondence between the physical address and the logical address of the memory area to which the data is written on the address translation table read into the buffer, updates the free-space information flag on the erase table read into the buffer, and writes the updated erase table and the updated address translation table into a flash memory.

Desirably, the process of writing the updated erase table and the address translation table into the flash memory is performed in accordance with an order of the second erase table, the address translation table, and the first erase table. The erase table is disposed so as to be divided into a plurality of memory areas having different erase units. The erase table disposed so as to be divided into a plurality of memory areas having different erase units is multiplexed on the memory areas having different erase units, and the multiplexed erase tables may be sequentially updated and used so as to alternately change the erase unit. Similarly, the address translation table is also preferably multiplexed. To retrieve a memory area to which rewrite data is to be written, a search start physical address is determined by using a random number, and an erase table corresponding to the determined physical address is used as the second erase table.

[5] A memory card according to another aspect of the invention has an erasable programmable nonvolatile memory. The nonvolatile memory has, in a part of a memory array, an erase table in which a free-space information flag is associated with each physical address of a memory area and an address translation table in which a physical address of the memory area is associated with each logical address. The free-space information flag has a first status indicating that the corresponding memory area is permitted to be erased and a second status indicating that the corresponding memory area is inhibited to be erased. A memory area to which rewrite data is to be written is determined by a physical address according to the free-space information flag in the first status retrieved. To retrieve a memory area to which rewrite data is to be written, a search start physical address is determined by using a random number, and an erase table corresponding to the determined physical address is used as a second erase table. The memory area in which data to be rewritten is determined by referring to the address translation table.

BRIEF DESCRIPTION OF THE DRAWINGS

FIG. 4 is a diagram illustrating the details of a part of an erase table, that is, a divided erase table at the head.

DETAILED DESCRIPTION OF THE PREFERRED EMBODIMENTS

Figure 1:
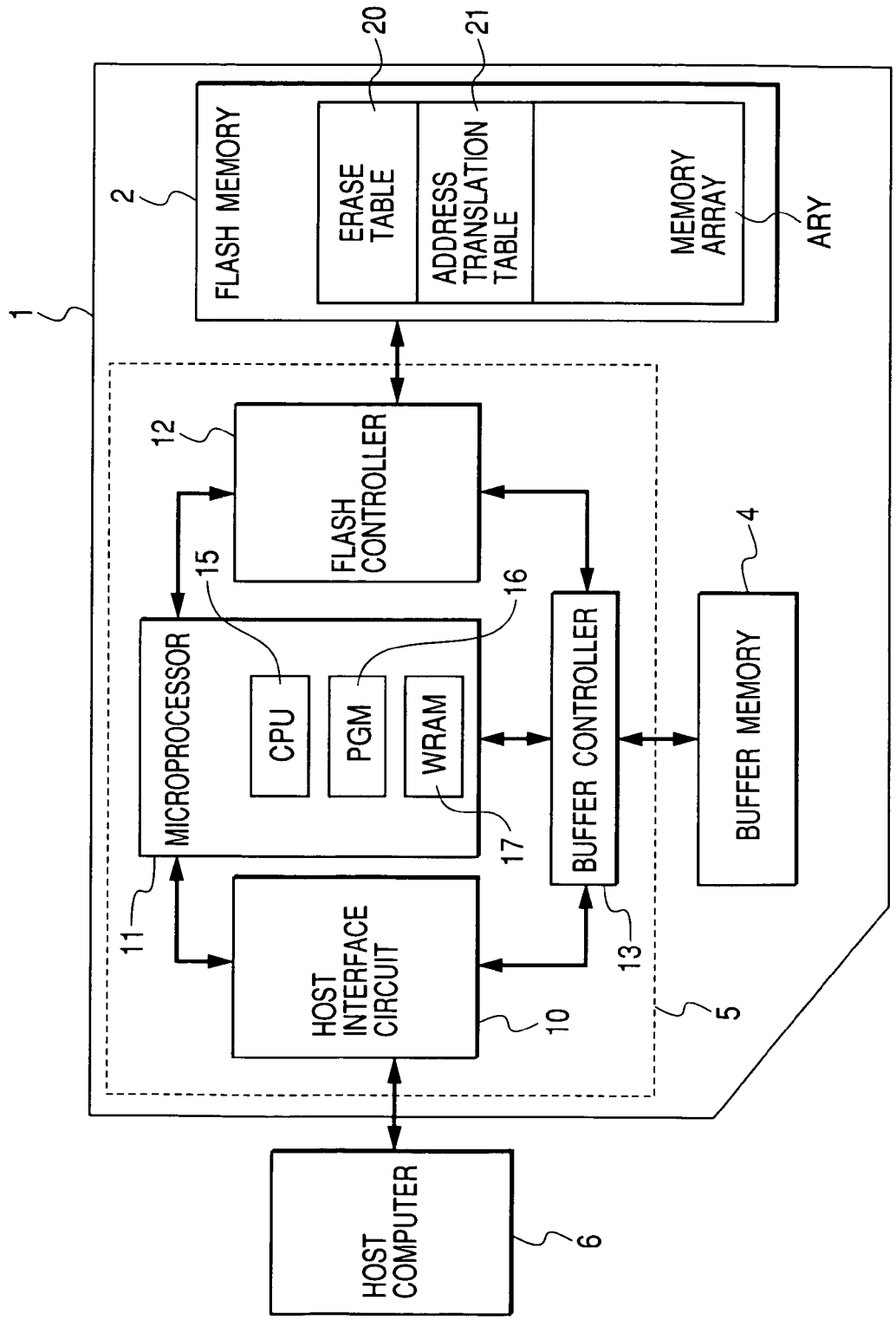
FIG. 1 is a block diagram showing an example of a memory card according to the invention.

FIG. 1 shows an example of a memory card according to the invention. A memory card 1 has, on a mounting board, an erasable programmable nonvolatile memory such as a flash memory 2, a buffer memory 4 taking the form of a DRAM (Dynamic Random Access Memory) or an SRAM (Static Random Access Memory) and, a card controller 5 for performing memory control and external interface control.

The buffer memory 4 and flash memory 2 are subjected to an access control of the card controller 5. The flash memory 2 has, although not shown, a memory array ARY in which a number of electrically erasable programmable nonvolatile memory cell transistors are arranged in a matrix. A memory cell transistor (also written as a flash memory cell) is constructed by, although not shown, a source and a drain formed in a semiconductor substrate or in a well, a floating gate formed via a tunnel oxide film in a channel area between the source and the drain, and a control gate formed on the floating gate via an interlayer insulating film. The control gate is connected to a corresponding word line, the drain is connected to a corresponding bit line, and the source is connected to a source line. In the memory cell transistor, when electrons are injected to the floating gate, a threshold voltage increases. When electrons are withdrawn from the floating gate, the threshold voltage decreases. The memory cell transistor stores information according to the high or low threshold voltage relative to a word line voltage (control gate application voltage) for reading data. Although not limited, in the specification, a state where the threshold voltage of a memory cell transistor is included in the lowest threshold voltage distribution will be called an erase state, and a state where the threshold voltage is included in a threshold voltage distribution higher than the erase state will be called a write state. A plurality of threshold voltage distributions of the write state may exist.

In FIG. 1, the card controller 5 performs an external interface control according to IDE disk interface specifications or the like with, for example, a host computer (host) 6. The card controller 5 has an access control function of accessing the flash memory 2 in accordance with an instruction from the host computer 6. The access control function is a hard-disk-compatible control function. For example, when the host computer 6 manages a collection of sector data as file data, the card controller 5 performs a control of accessing the flash memory 2 by matching the sector address as a logic address and a physical memory address. In FIG. 1, the card controller 5 is constructed by a host interface circuit 10 and, as computation control means, a microprocessor (MPU) 11, a flash controller 12, and a buffer controller 13. The flash controller 12 has a not-shown ECC circuit.

The MPU 11 has a CPU (Central Processing Unit) 15, a program memory (PGM) 16, a work RAM (WRAM) 17, and the like and controls the entire card controller 5. The program memory 16 has an operation program of the CPU 15 and the like.

The host interface circuit 10 is a circuit interfacing with the host computer 6 such as a personal computer or work station in accordance with a predetermined protocol such as ATA (ATAttachment), IDE (Integrated Device Electronics), SCSI (Small Computer System Interface), MMC (MultiMediaCard; Trademark), PCMCIA (Personal Computer Memory Card International Association), or the like. The host interface operation is controlled by the MPU 11.

The buffer controller 13 controls the memory access operation of the buffer memory 4 in accordance with an access instruction given from the MPU 11. In the buffer memory 4, data input to the host interface circuit 10 or data output from the host interface circuit 10 is temporarily stored. In the buffer memory 4, data read from the flash memory 2 or data to be written to the flash memory 2 is temporarily stored.

The flash controller 12 controls reading operation, erasing operation, and writing operation on the flash memory 2 in accordance with an access instruction given from the MPU 11. The flash controller 12 outputs read control information such as a read command code and read address information in the reading operation, outputs write control information such as a write command code and write address information in the writing operation, and outputs erase control information such as an erase command in the erasing operation. The not-shown ECC circuit generates an error correction code for data to be written into the flash memory 2 and adds the error correction code to the write data in accordance with an instruction given from the MPU 11. The ECC circuit also performs an error detecting/correcting process by using the error correction code added to the read data on the data read from the flash memory 2, and corrects an error which occurs in the range of the error correcting capability.

The flash memory 2 has an erase table 20 and an address translation table 21 in a part of the memory array ARY.

Figure 2:
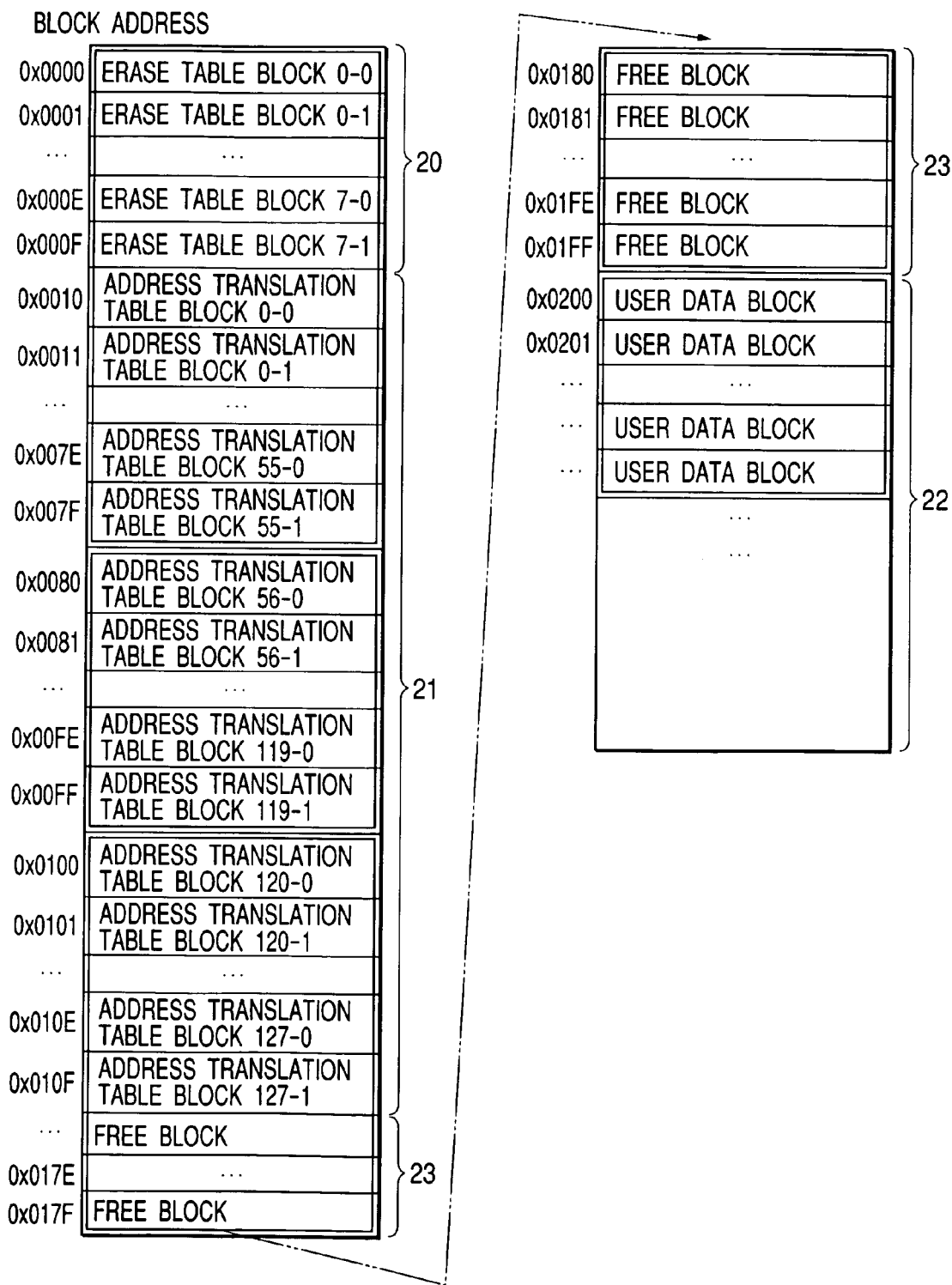
FIG. 2 is an address map illustrating a storage area of a flash memory 2.

FIG. 2 illustrates a memory area of the flash memory 2. The memory area (memory array ARY) of the flash memory 2 is roughly divided into the erase table 20, the address translation table 21, a user area 22, and a free block area 23 which becomes necessary when the erase table and the address translation table are updated. A block address as a physical address is given on a block (memory sector) unit basis to each area. Although not limited, one block has a storage capacity of integer times of 512B, for example, about 2 KB (kilobytes)=512B×4. A memory cell array included in one block is selected by one word line or one kind of a word line selection signal and is a unit of the erasing process and the writing process. To be specific, a high voltage necessary for the erasing process and the writing process is applied on a word line unit basis. One block is larger than the capacity of 512B of a sector (storage sector) as a rewrite unit in a storage such as an HDD. For example, one block has a storage capacity obtained by adding an ECC code to four storage sectors.

Each of the erase table 20 and the address translation table 21 is divided in two blocks and each division unit is multiplexed within the two blocks. For example, the erase table is disposed in block addresses 0x0000 to 0x000F and is divided in two blocks by using two blocks like 0x0000 and 0x0001 as a unit. In FIG. 2, in erase table blocks 0-0 and 0-1, the divided head erase table is multiplexedly formed. The address translation table is disposed from the block address 0x0010 to the block address 0x010F and is divided in two blocks by using two blocks like 0x0010 and 0x0011 as one unit. In FIG. 2, in the address translation table blocks 0-0 and 0-1, the divided head address table is multiplexedly formed.

Figure 3:
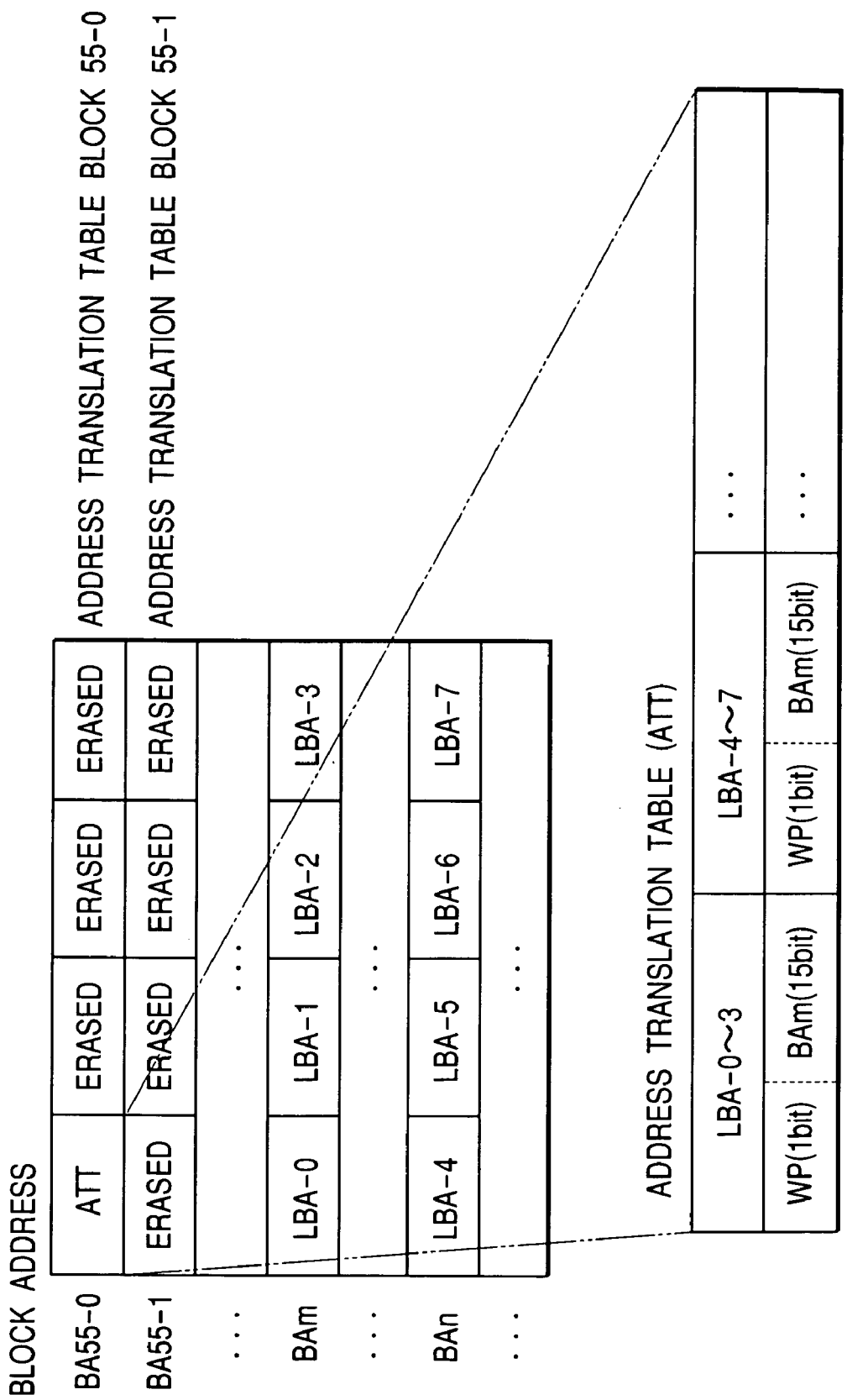
FIG. 3 is a diagram illustrating the details of a part of an address translation table, that is, a divided address translation table at the head.
Figure 5A:
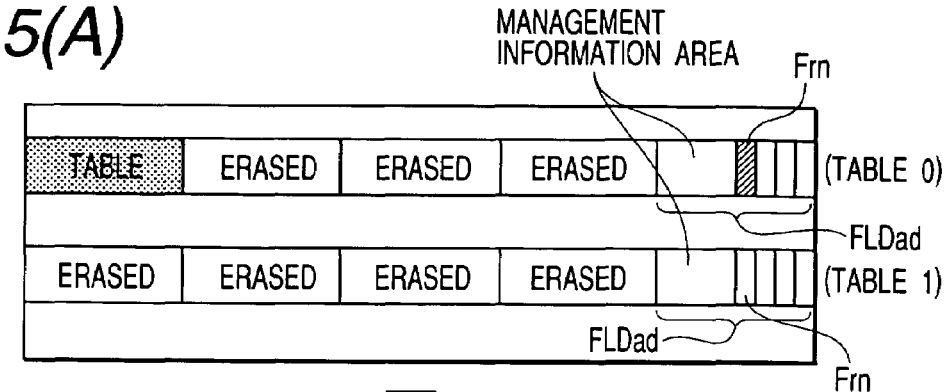
FIGS. 5A to 5D are diagrams illustrating a control method of sequentially validating one of multiplexed eight tables (an erase table ET and an address translation table ATT) in conjunction with FIGS. 6E to 6H and FIGS. 7I and 7J.
Figure 5B:
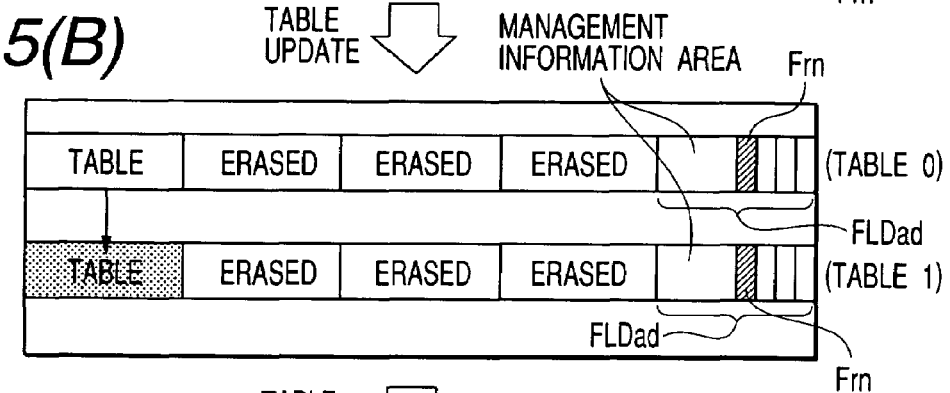
Figure 5C:
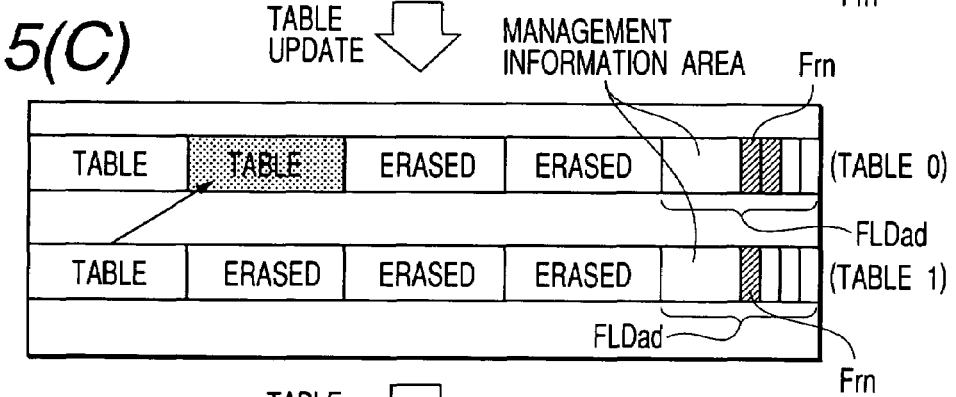
Figure 5D:
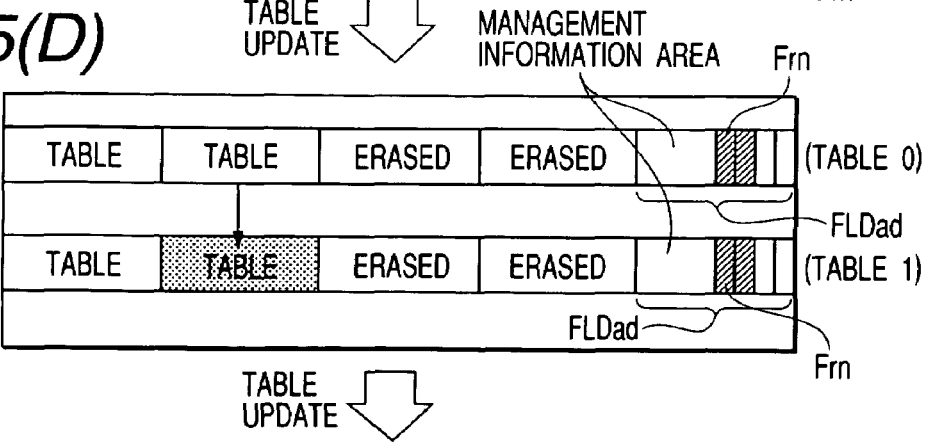
Figure 6E:
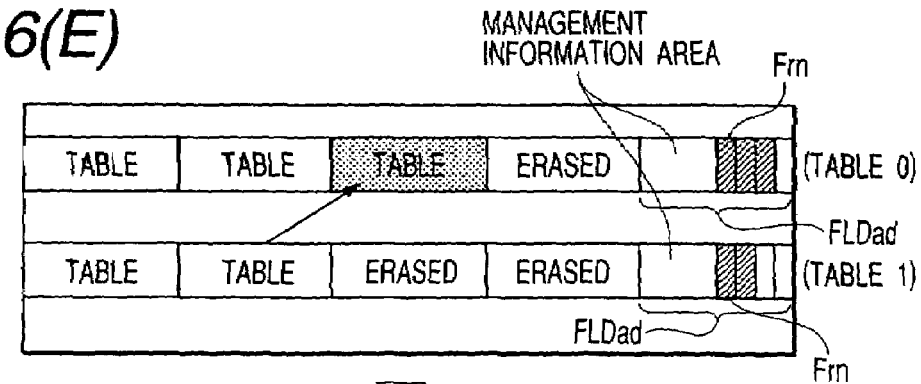
FIGS. 6E to 6H are diagrams illustrating the control method continued from FIG. 5D.
Figure 6F:
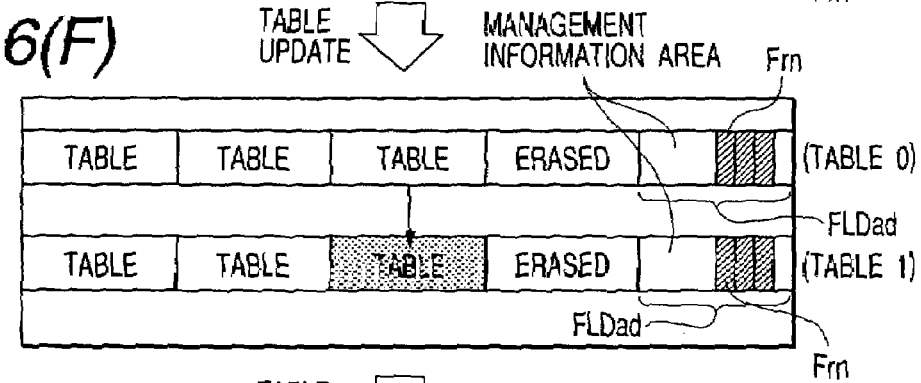
Figure 6G:
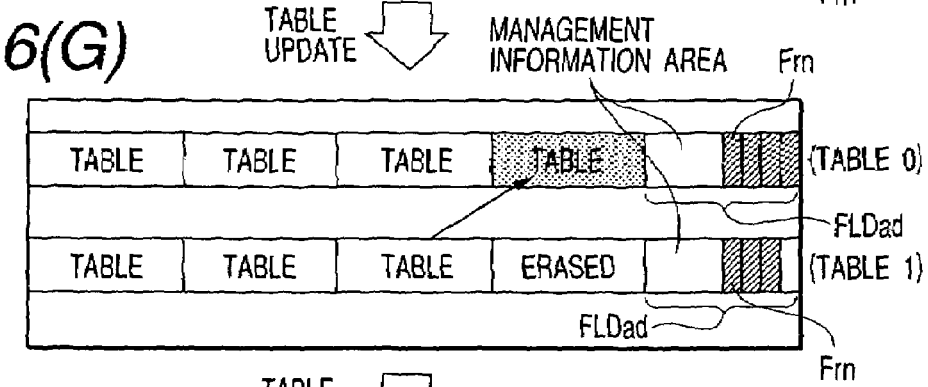
Figure 6H:
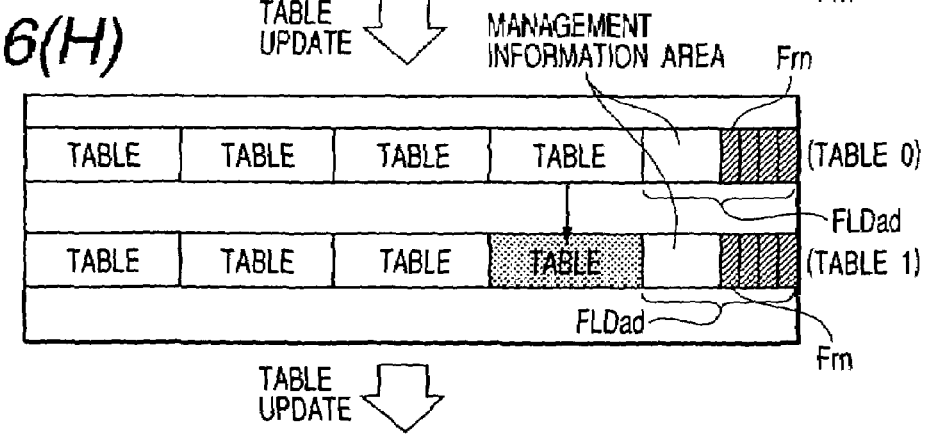

FIG. 3 shows the details of a part of the address translation table, that is, the divided head address translation table. ATT denotes a divided address translation table which is multiplexed in eight areas including areas marked with "erased" in the diagram. The multiplexed eight address translation tables are made valid one by one in order. The divided address translation table ATT has information for associating the physical address of a corresponding memory sector, that is, one block address to each logical address corresponding to four storage sectors. Information associating a logical address and a physical address like, for example, from the head of the address translation table ATT, block address BAm is associated with logical addresses LBA-0 to LBA-3, and the block address BAn is associated with logical addresses LBA-4 to LBA-7. The logical address information in the address translation table is disposed, for example, in ascending order or descending order. In FIG. 3, the memory block address such as the block address BAm, BAn, or the like indicates the address of a memory block corresponding to successive logical address four sectors and has, for example, 15 bits. In this case, a write protect bit WP of one bit is added to each address of a memory block. In an access instruction from the host computer 6 to the memory card 1, the address of a sector to be accessed is designated (also called a logical sector address or a logical address). By using the logical sector address as a search key, a corresponding block address is retrieved by using the address translation table.

FIG. 4 shows an example of the details of a part of the erase table, specifically, the divided erase table at the head. ET denotes one divided erase table. In the diagram, the erase table is multiplexed in eight areas including areas marked with "erased". The multiplexed eight erase tables ET are validated one by one in order. In the divided erase table ET, a free-space information flag (also simply called a flag) is associated with a physical address of a memory area, that is, a block address. Specifically, bits of flags are sequentially filled from the head of the erase table ET on a bit unit basis like a free-space information flag FLG of the head block (block address BA0-0) and a free-space information flag FLG of the next block (block address BA0-1). The free-space information flag FLG of one bit indicates the status (erase permitted status or erase inhibited status) of a corresponding block. "1" denotes the erase permitted status and "0" indicates the erase inhibited status. The free-space information flags in the erase table may be arranged in accordance with the ascending order of the block addresses (physical addresses) or the descending order.

Figure 7I:
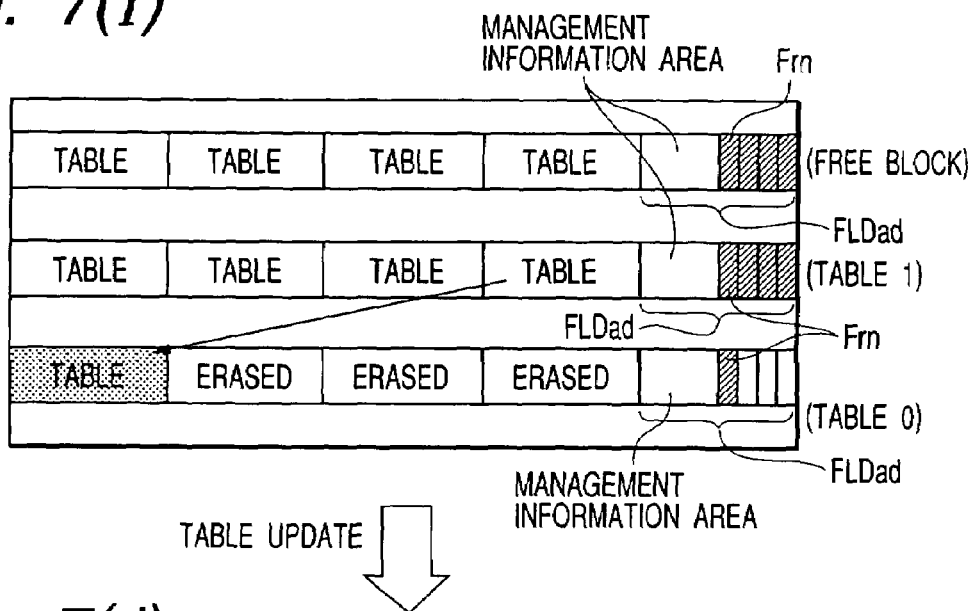
FIGS. 7I and 7J are diagrams illustrating the control method continued from FIG. 6H.
Figure 7J:
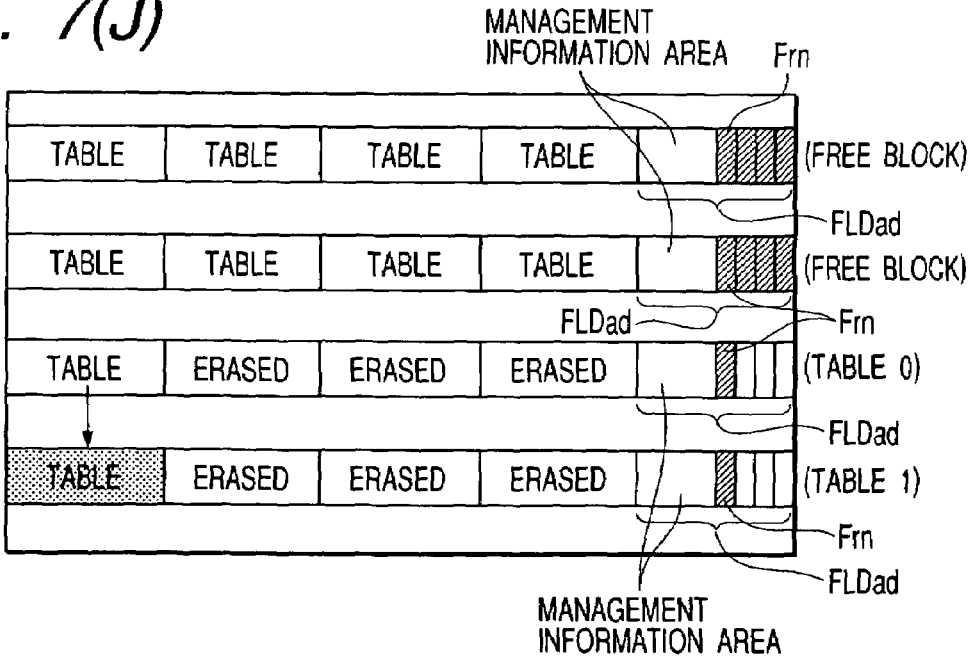

FIGS. 5A to 5D to FIGS. 7I and 7J show a control method of sequentially validating multiplexed eight tables (the erase table ET and the address translation table ATT) one by one. In FIGS. 5A to 5D to FIGS. 7I and 7J, a portion marked with "table" denotes a table which is made valid. A valid table is identified by an update flag Frn of a management area FLDad. The update flag Frn has four bits in each memory block in correspondence with the divided table. When the corresponding divided table is made valid, "1" is set and the state is maintained until data is erased. The divided tables multiplexed in two memory blocks are sequentially selected while alternately changing the memory blocks. When the location of the border of the update flags Frn of "1" and "0" is retrieved at the head in the selection direction, the divided table corresponding to the update flag Frn of "1" is made valid. The location of the valid divided table is changed when data in the table is updated. The initial state of the eight tables is the state of FIG. 5A. When the tables are updated from the state of FIG. 5A to FIG. 5B, updating is performed by additional writing. Updating from FIG. 5B to FIG. 5H is also performed by additional writing. In short, erasing operation is not performed but writing is performed by masking the whole portion other than a portion to which data is newly added (by not selecting the portion as a portion which is not selected). When the table is updated from the state of FIG. 5H, the block in the free block area 23 is rewritten, thereby newly generating a table 0. The original table 0 is re-used as a free block. The state at this time is shown in FIG. 7I. At the time of updating the table from the state of FIG. 7I, a block in the free block area 23 is rewritten, thereby newly generating a table 1. The original table 1 is re-used as a free block. The state at this time is shown in FIG. 7J. The state of FIG. 7J is similar to that of FIG. 5B. When the state is updated next, the state 7J becomes the state of FIG. 5C. By the process, the frequency of rewriting a nonvolatile memory cell on a table can be decreased.

Figure 8:
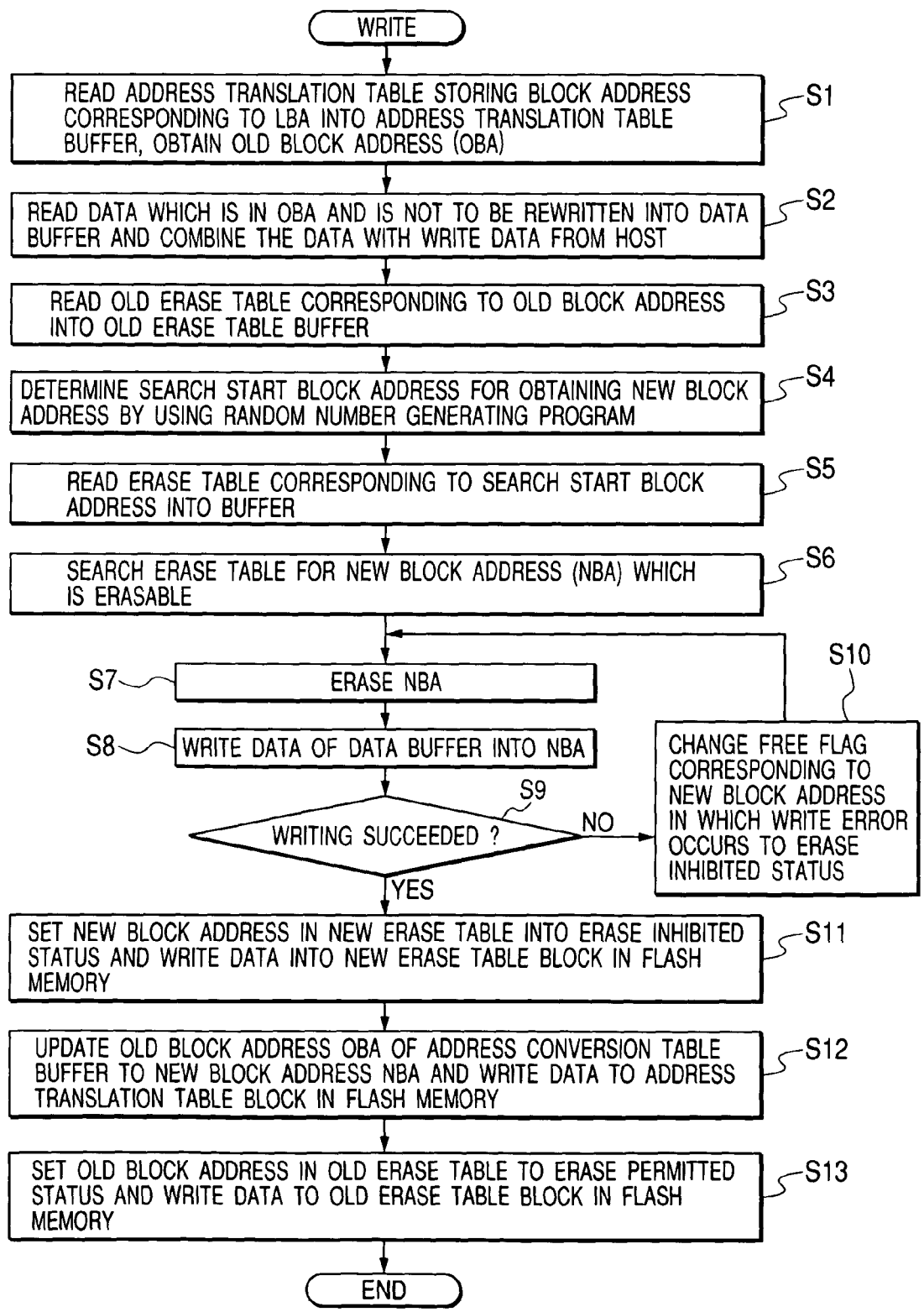
FIG. 8 is a flowchart showing a write access operation process of a memory card, using an erase table and an address translation table.

FIG. 8 shows the flow of a write access operation process of a memory card using the erase table 20 and the address translation table 21. When the host computer 6 makes a write access, the card controller 5 reads an address translation table ATT in which a block address corresponding to a logical address LBA (logical sector address) is stored into the address translation table buffer in the buffer memory 4 (S1). Since the logical address information indexed in the address translation table 21 is arranged in ascending order, it is sufficient to select two memory blocks in which the address translation table is disposed in accordance with the ascending order. First, the management area FLDad illustrated in FIG. 5 is read for the selected two memory blocks to grasp the location of the valid address translation table ATT among the multiplexed tables. On the basis of the location, the address translation table ATT is read. By searching the read address translation table, a block address (called an old block address) OBA which currently corresponds to the logical address of a block to be written is obtained (S1).

The card controller 5 reads data which is not to be rewritten from the data stored in the old block address OBA into the data buffer of the buffer memory 4 and combines the read data with write data from the host computer 6 (S2). For example, when the write data is of one storage sector, data of three storage sectors is read from the old block address OBA and data of total four storage sectors is used as rewrite data.

Next, the card controller 5 reads an erase table (hereinbelow, called an old erase table) ET corresponding to the old block address OBA into an old erase table buffer in the buffer memory 4 (S3). Since the entire divided erase table can be indexed in ascending order of block addresses, it is sufficient to select the erase table ET to be read in accordance with the order. The erase table to be read is one of the divided erase tables. As described above, one divided erase table is multiplexed, so that the one of divided erase tables multiplexed is read by referring to the status of the update flag Frn. After that, the microprocessor executes a random number generating program in the ROM 16 and obtains a search start block address for obtaining a block address (new block address) to which write data is written (S4). The random number generating program used here may generate pseudo random numbers which are biased. The card controller 5 reads an erase table (referred to as a new erase table) corresponding to the search start block address obtained as described above into the buffer memory (S5). In this case as well, an erase table to be read is one of the divided erase tables. As described above, one divided erase table is multiplexed and one of the multiplexed divided erase tables is read as a new erase table by referring to the status of the update flag Frn.

The memory controller 5 retrieves a new block address (NBA) which is permitted to be erased from the new erase table read to the memory buffer 4 (S6). Specifically, in ascending or descending order from the search start block address obtained by executing the random number generating program, a free-space information flag FLG in the new erase table ET read to the memory buffer 4 is checked. For example, the block address corresponding to the location of the free-space information flag FLG of "1" retrieved first is set as the new block address NBA. A batch erasing process is performed on the memory block of the new block address (S7). After that, the rewrite data generated in step S2 is written into the memory block of the new block address (S8). Whether the writing process has been performed successfully or not is determined (S9). If the writing fails, the free-space information flag FLG corresponding to the new block address in which the write error occurs is changed to the erase inhibited status "0" on the new erase table read onto the buffer memory 4 (S10). The program returns to step S6 where another erasable block address is retrieved from the new erase table, and the process is performed again.

When it is determined in step S9 that the writing was succeeded, first, the free-space information flag FLG corresponding to the new block address is set to an erase inhibited status (the new block address is set to the erase inhibited status) on the new erase table read on the buffer memory 4. Data of the changed new erase table is written as rewrite data into the memory block of the new erase table on the flash memory 2 (S11). After that, the block address corresponding to the logical address to be accessed of this time is changed from the old block address OBA to the new block address NBA on the address translation table ATT read to the buffer memory 4. The data of the changed address translation table is written as rewrite data into the memory block of the address translation table on the flash memory 2 (S12). Finally, on the old erase table read on the buffer memory 4, the free-space information flag FLG corresponding to the old block address is set to the erase permitted status (the old block address is set to the erase permitted status). The changed data of the old erase table is written as rewrite data into a memory block in the old erase table on the flash memory 2 (S13).

Figure 9:
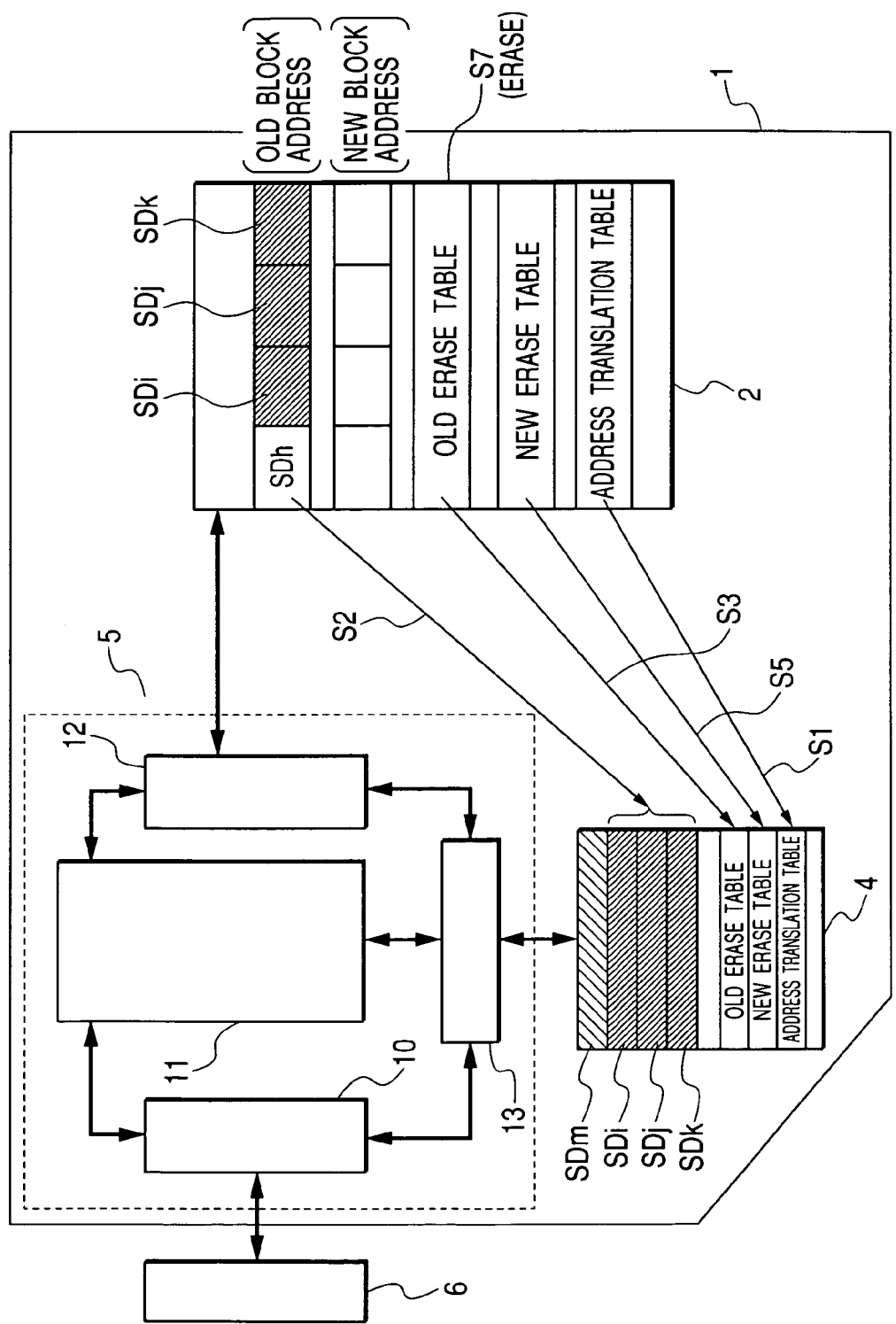
FIG. 9 is a diagram schematically showing main processes up to step S7 in FIG. 8.
Figure 10:
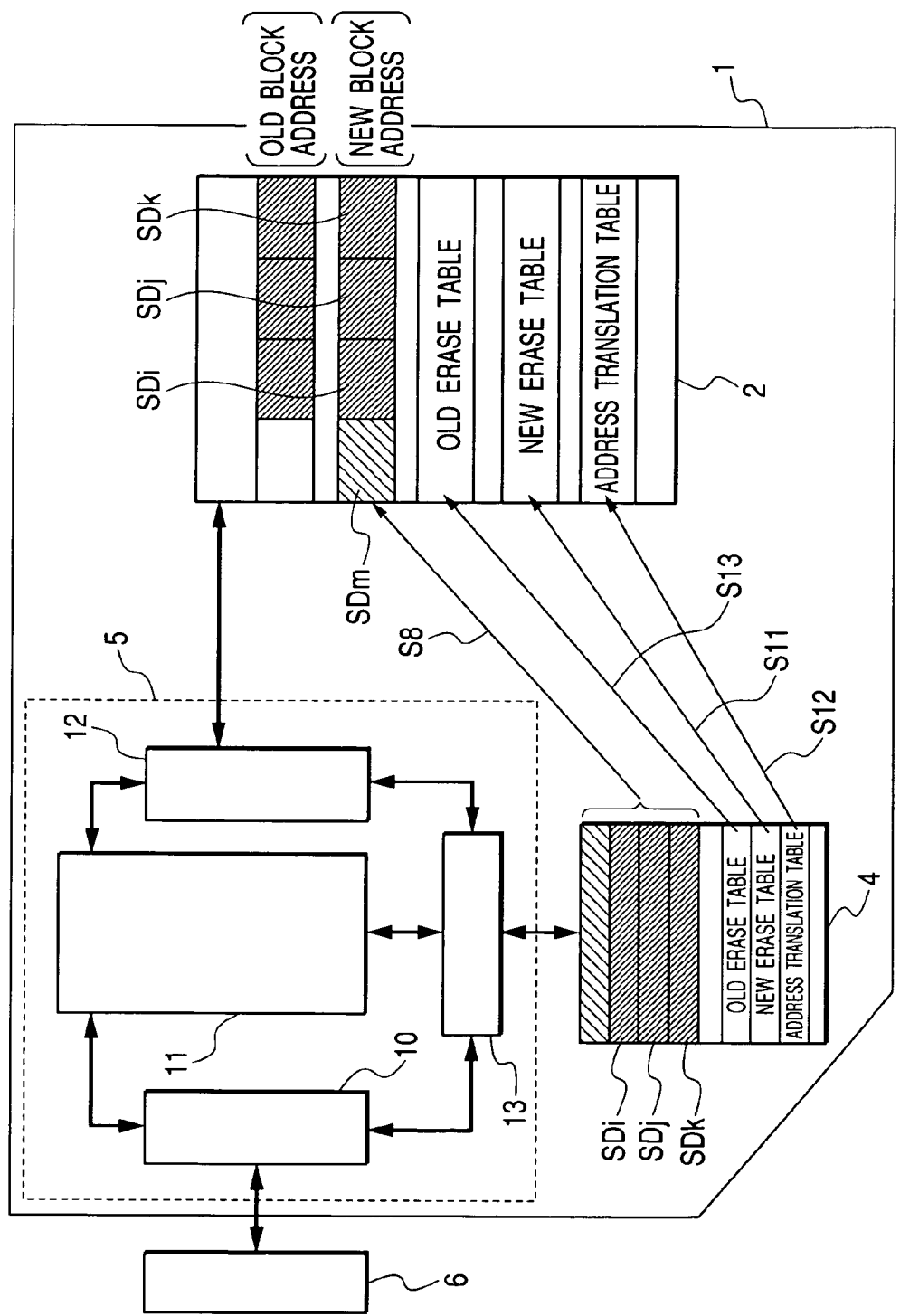
FIG. 10 is a diagram schematically showing main processes from step S8 to step S13 in FIG. 8, as a continuation of FIG. 9.

FIG. 9 schematically shows the main processes up to step S7 described in FIG. 8. FIG. 10 schematically shows main processes from step 8 to step S13 in FIG. 8, subsequent to FIG. 9. It is assumed here that block data of an old block address includes sector data SDh, SDi, SDj, and SDk, and the sector data SDh as one of them is rewritten to sector data SDm by a write access from the host computer 6.

As obvious from FIGS. 9 and 8, even after the memory block in the new block address is erased in step S7 and the rewrite data SDm, SDi, SDj, and SDk is written into the memory block of the new block address in step S8, the data SDh, SDi, SDj, and SDk which is not subjected to rewriting remains as it is in the memory block of the old block address. On the flash memory 2, the old erase table and the address translation table remain as they are. Therefore, even if the operation power source is shut down by withdrawal of the memory card 1 from the card slot before the writing in step S8 is completed, the old data remains as it is for the reason that the memory block to which rewrite data is written is different from the memory block of the original data to be written. Further, after completion of the writing of the rewrite data in step S8, first, the new erase table in which the new block address is set to the erase inhibited status is written back to the flash memory 2 (S11). The writing is performed on another multiplexed memory block. By completion of the process of step S11, prevention of an undesired erase of data written in a new block address is guaranteed. After that, the address translation table in which the old block address is changed to the new block address is written to the flash memory 2 (S12). It enables an access to the new block address. Since the writing is also performed on another multiplexed memory block, even if the operation power source is shut down before completion of the process of step S12, the address translation table of the old block address remains accessible. At this stage, the old erase table remains as it is. An easy access to data in an old block address is guaranteed. The old erase table of which setting is changed is written finally (S13). After completion of the writing, the memory block data of the old block address is permitted to be erased and therefore becomes unnecessary. Even the process of step S13 is interrupted due to shutdown of the power source, re-use of the memory block of the old block address simply becomes impossible, and a necessary data access is made without a hitch.

As obvious from the above, the order of processes in steps S11, S12, and S13 is important from the viewpoint of surely preventing data loss due to undesired shut-down of the power source and facilitating the logical matching of stored information management. Specifically, first, the process (S11) of protecting the data of the new block address by inhibiting erase of the data is performed. After that, the process (S12) of preventing the data remaining in the old block address from being easily read is carried out, and the process (S13) of permitting the data remaining in the old block address to be erased is performed. For example, when the order of the processes of S11 and S13 is interchanged and the process of S13 is completed first, a state where an erase of both of the new block address and the old block address is permitted occurs. If the power source is shut down in such a state, the state in which both of the addresses are permitted to be erased is maintained and it is feared that necessary data is undesirably erased.

Further, by using two or more flash memories to be mounted on the memory card or by dividing a single flash memory into banks and setting an erase table storage area and an address translation table storage area in different flash memories or different banks, a transfer of a new erase table from the card controller 5 to the flash memory and a transfer of the new address translation table are performed and, after that, writing of the new erase table and writing of the new address translation table are executed in parallel (S11 and S12 in FIG. 8 are performed in parallel, not sequentially), thereby enabling the logical matching of the storage information management to be obtained more easily.

Figure 11:
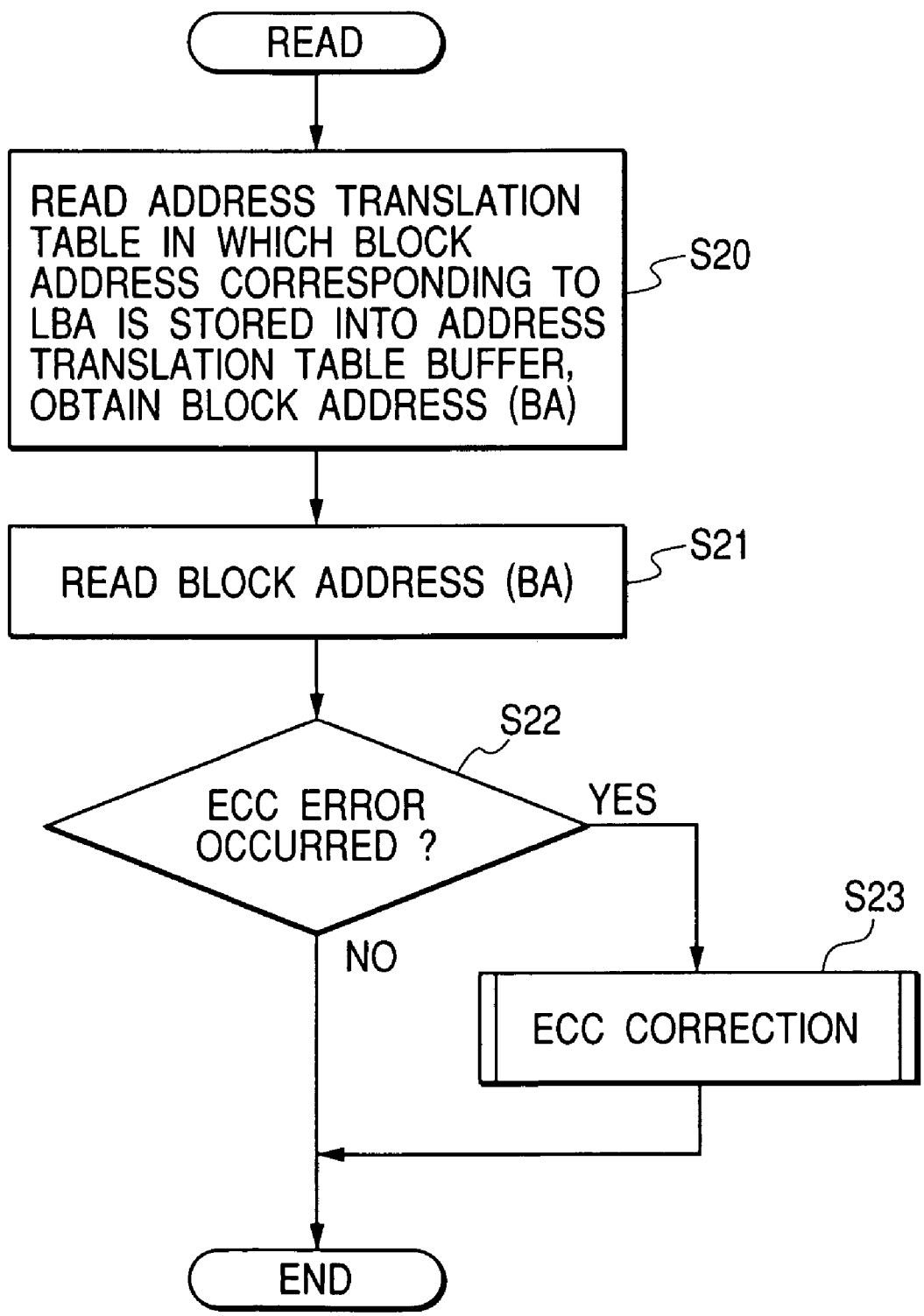
FIG. 11 is a flowchart illustrating a read access operation process of the memory card, using the address translation table.

FIG. 11 shows the flow of a read access operation process of the memory card using the address translation table 21. When a read access is made from the host computer 6, the card controller 5 reads the address translation table ATT in which a block address corresponding to the logical address LBA (logical sector address) is stored into the address translation table buffer in the buffer memory 4 (S20). Since the logical address information for indexing the address translation table is in ascending order in the address translation table 21, it is sufficient to select two blocks in which the address translation table is disposed in accordance with the logical address information. The management area FLDad shown in FIG. 5 or the like is read from the selected two blocks, the location of the valid address translation table ATT is grasped from the multiplexed tables, and the address translation table ATT is read on the basis of the location. By retrieving the read address translation table, the block address BA currently corresponding to the logical address to be read is obtained (S20).

The card controller 5 reads data stored in the block address BA (S21). An ECC error is checked on the read data (S22). If there is an error, an ECC correcting process is performed (S23) and the read data is output to the host computer 6.

Figure 12:
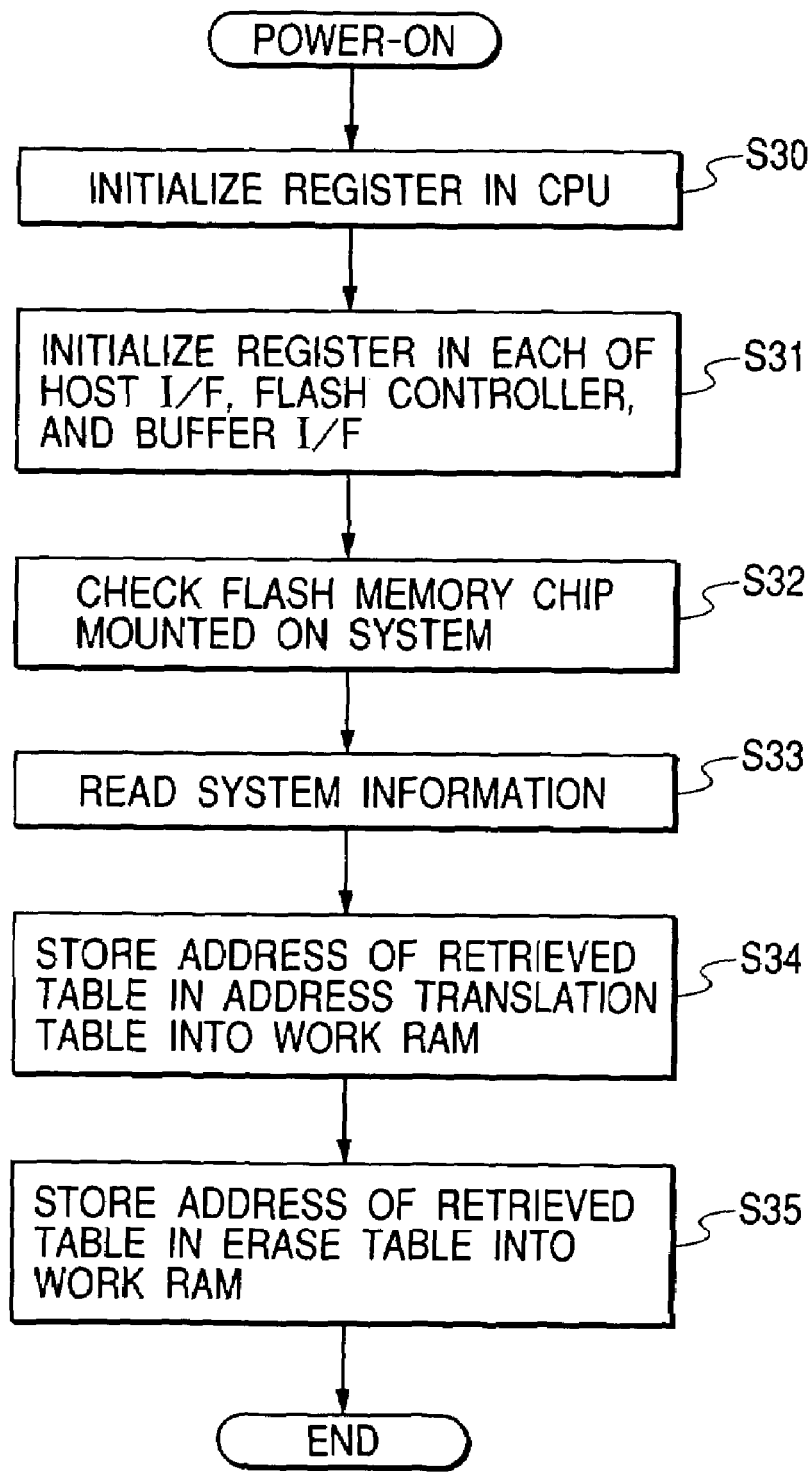
FIG. 12 is a flowchart showing a power-on process of the memory card.
Figure 13:
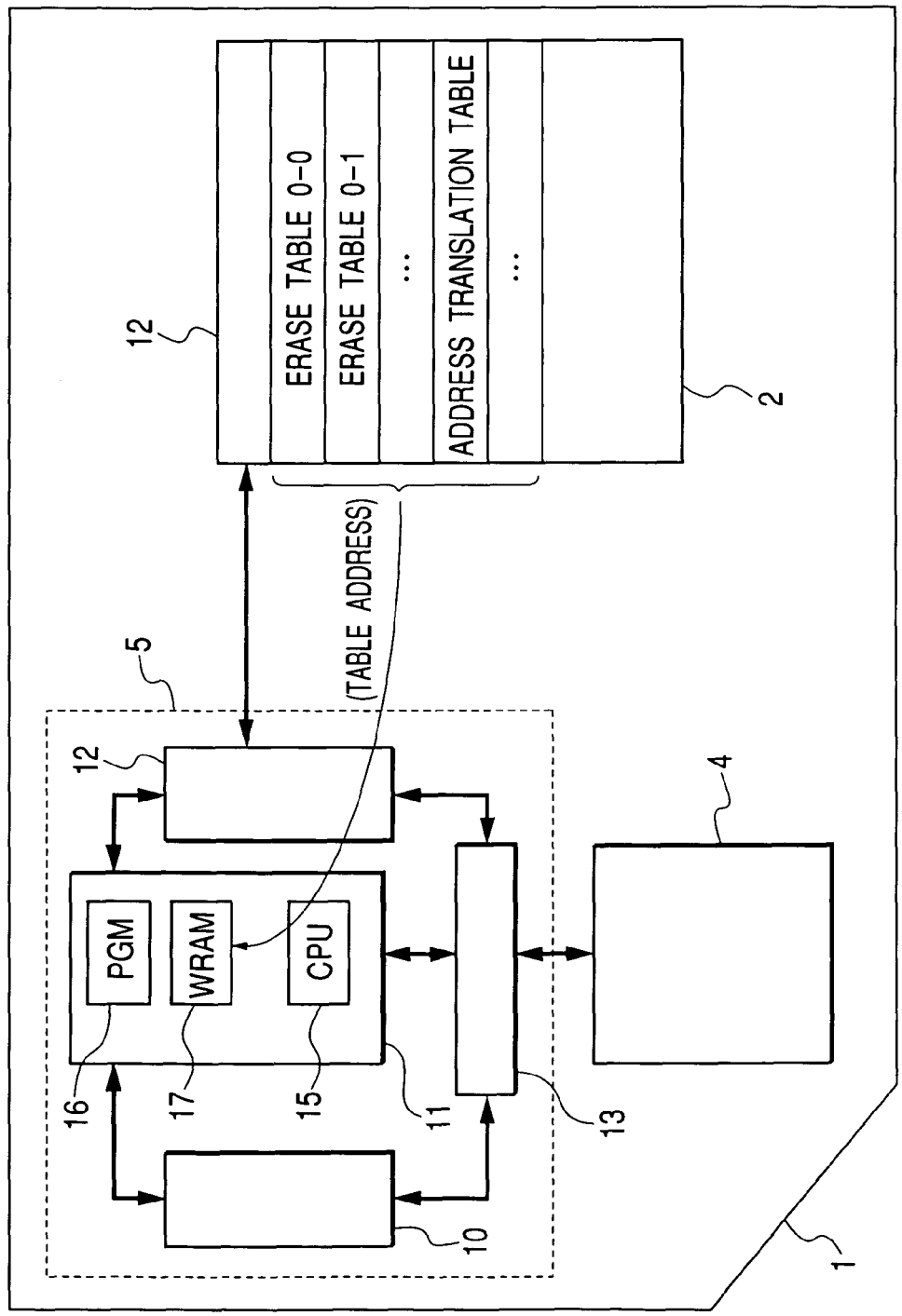
FIG. 13 is a diagram showing a state of a table address storing process in the power-on process.

FIG. 12 illustrates the power-on process of the memory card 1. When the power of the memory card 1 is turned on, a register in the CPU 15 is initialized (S30), and registers in the host interface circuit 10, flash controller 12, and buffer controller 13 are initialized (S31). The flash memory 2 mounted on the memory card 1 is checked (S32) and system information is read from the flash memory 2 (S33). After that, the address translation table is searched and the address of the table is stored into the work RAM 17 (S34). Similarly, the erase table is searched and the address of the table is stored into the work RAM 17 (S35). The table address stored into the work RAM 17 is the address of each of memory blocks of the table divided or the head block address in the whole erase table and the head block address of the whole address translation table. FIG. 13 illustrates a state of the table address storing process. By obtaining the table address from the work RAM 17 in the process responding to a read access and a write access from the host computer 6, it contributes to increase in the speed of an access to the table.

A control regarding validity of a memory block will now be described. In an initial state, an address translation table is formed by eliminating an invalid memory block in which an error occurs. On the erase table, the free-space information flag of such an invalid memory block is set to an erase inhibited state. Therefore, the invalid memory block does not becomes an object of reading and writing. When an error which cannot be solved is detected during operation, it is sufficient to similarly change the address translation table and the erase table in correspondence with the memory block. Consequently, each memory block does not have to positively have a valid bit indicative of validity of the memory block. However, each memory block may have a valid bit for the purpose of system maintenance.

Although the invention achieved by the inventor herein has been concretely described above, obviously, the invention is not limited to foregoing embodiment but can be variously modified without departing from the gist.

For example, a table may not be always divided or multiplexed. The erasing process and the writing process may not be always performed on a word line unit basis. The flash memory is not limited to the configuration of storing binary data by one memory cell but may have the configuration of storing multi-value information of four or more values. Obviously, the nonvolatile memory is not limited to the flash memory but may be a memory of another storage form such as a high-dielectric-constant memory. The control circuit such as the card controller does not have to have a host interface circuit such as an IDE. The invention can be also applied to a memory card standardized so that the function is provided for a host computer.

Effects obtained by representative inventions of the inventions disclosed in the specification will be briefly described as follows.

Since the address translation table is used, an access to a normal memory area at higher speed can be realized.

By dividing or multiplexing a table, an influence of disturbance of the erasing and writing processes can be lessened.

By dividing or multiplexing a table and by dynamically changing the rewrite memory area, the life can be increased more than the limitation of the number of rewriting times of a memory cell.

By the dynamic change of the rewrite memory area, loss of an address and undesirable loss of storage information which is not to be rewritten caused by shutdown of the operation power source can be prevented.

What is claimed is:

1. A memory card comprising:
nonvolatile memory; and
a control circuit,
wherein a memory array of said nonvolatile memory has an erase table in which a free-space information flag is associated with each physical address of a memory area,
wherein said free-space information flag has one of a first status and a second status,
wherein said first status is indicating that the corresponding memory area is permitted to be erased and a second status indicating that the corresponding memory area is inhibited to be erased,
wherein said control circuit refers to said erase table for search of a memory area to which rewrite data is written, and
wherein said control circuit is adapted to store into a predetermined area of said nonvolatile memory an updated version of the erase table, which includes an updated free-space information flag from a previous version of the erase table, the predetermined area being a different area than an area in which the previous version of the erase table is stored.

2. A memory card comprising:
an nonvolatile memory; and a control circuit,
wherein said nonvolatile memory has, in a part of a memory array, an erase table in which a free-space information flag is associated with each physical address of a memory area,
wherein said free-space information flag has one of a first status and a second status,
wherein said first status is indicating that the corresponding memory area is permitted to be erased and said second status indicating that the corresponding memory area is inhibited to be erased,
wherein said control circuit uses a first physical address according to the free-space information flag in the first status obtained by searching said erase table as a memory area to which rewrite data is written, and
wherein said control circuit is adapted to store into a predetermined area of said nonvolatile memory an updated version of the erase table, which includes an updated free-space information flag from a previous version of the erase table, the predetermined area being a different area than an area in which the previous version of the erase table is stored.

3. A memory card comprising:
nonvolatile memory; and a control circuit,
wherein a memory array of said nonvolatile memory has an erase table and an address translation table, wherein a free-space information flag in said erase table is associated with each physical address of a memory area, wherein a physical address of a memory area in said address translation table is associated with each logical address, wherein said free-space information flag indicates whether a corresponding memory area is permitted to be erased or not,
wherein said control circuit determines a physical address of a memory area to which rewrite data is written by referring to the free-space information flag of said erase table, updates the address translation table by associating the physical address of the memory area with the logical address and updates the free-space information flag of the erase table, and
wherein said control circuit is adapted to store into a predetermined area of said nonvolatile memory an updated version of the erase table, which includes an updated free-space information flag from a previous version of the erase table, the predetermined area being a different area than an area in which the previous version of the erase table is stored.

4. The memory card according to claim 3, wherein said erase table is stored into a plurality of memory areas each of which is arranged to different erase units, and wherein a first erase table is referred to when a memory area to which rewrite data is written is determined,
wherein a second erase table stores a free space information flag according to a second memory area in which data to be rewritten, and
wherein said first erase table is formed in a memory area having an erase unit different from a second erase unit of the second erase table.

5. The memory card according to claim 4, wherein processes of updating the free-space information flag of the erase table includes a first updating process of making a first free-space information flag in said first erase table corresponding to said first memory area to an erase inhibited status, and a second updating process of making a second free-space information flag in said second erase table corresponding to said second memory area to an erase permitted status.

6. The memory card according to claim 5, wherein said first updating process is performed and, after that, the second updating process is performed.

7. The memory card according to claim 6, wherein a process of updating an address translation table by associating a logical address and a physical address of said first memory area to which said data has been written with each other is performed between said first and second updating processes.

8. The memory card according to claim 7, wherein the erase table is disposed so as to be divided into a plurality of memory areas, each of said memory areas is assigned to different erase units, is multiplexed on the memory areas, and the multiplexed erase tables are sequentially updated and used so as to alternately change the erase unit.

9. The memory card according to claim 8, wherein said address translation table is arranged so as to be divided into a plurality of memory areas, each of said memory areas is assigned to different erase units, is multiplexed on the memory areas, and the multiplexed address translation tables are sequentially updated so as to alternately change the erase unit.

10. The memory card according to claim 3, wherein said control circuit searches said address translation table for a memory area from which data is read.

11. The memory card according to claim 3, wherein the erase unit of said nonvolatile memory is larger than a write unit instructed from the outside.

12. A memory card comprising:
nonvolatile memory; and a control circuit,
wherein a memory array of said nonvolatile memory has an erase table and an address translation table,
wherein a free-space information flag in said erase table is associated with each physical address of a memory area and said free-space information flag indicateswhether the corresponding memory area is permitted to be erased or not,
wherein a physical address of a memory area in said address translation table is associated with each logical address, and
wherein, at the time of rewriting stored information, said control circuit reads an address translation table corresponding to a logical address to be rewritten into a buffer, obtains a physical address of rewrite data from the read address translation table, reads a first memory area of the obtained physical address, stores the read data into the buffer, reads a first erase table corresponding to said obtained physical address into the buffer, reads a second erase table used to retrieve a second memory area to which rewrite data is written into the buffer, determines said second memory area to which rewrite data is written by referring to a free-space information flag of said second erase table, merges said stored data with data which is input from the outside, writes said merged data as rewrite data into said determined memory area, updates a correspondence between the physical address of said second memory area and the logical address on the address translation table read into the buffer, updates the free-space information flag on the first erase table and said second erase table read into the buffer, and writes the updated erase table and the updated address translation table into a flash memory.

13. The memory card according to claim 12, wherein the process of writing the updated erase table and the address translation table into the flash memory is performed in accordance with an order of the second erase table, the address translation table, and the first erase table.

14. The memory card according to claim 13, wherein the erase table is disposed so as to be divided into a plurality of memory areas, each of said memory areas is assigned to different erase units, is multiplexed on the memory areas, and the multiplexed erase tables are sequentially updated and used so as to alternately change the erase unit.

15. The memory card according to claim 14, wherein said address translation table is arranged so as to be divided into a plurality of memory areas, each of said memory areas is assigned to different erase units, is multiplexed on the memory areas, and the multiplexed address translation tables are sequentially updated so as to alternately change the erase unit.

16. A memory card comprising an nonvolatile memory,
wherein said nonvolatile memory includes, in a part of a memory array, an erase table in which a free-space information flag is associated with each physical address of a memory area and an address translation table in which a physical address of the memory area is associated with each logical address,
wherein said free-space information flag has a first status indicating that the corresponding memory area is permitted to be erased and a second status indicating that the corresponding memory area is inhibited to be erased,
wherein a memory area to which rewrite data is to be written is determined by a physical address according to the free-space information flag in the first status retrieved, and
wherein an updated version of the erase table, which includes an updated free-space information flag from a previous version of the erase table, is stored into a predetermined area of said nonvolatile memory, the predetermined area being a different area than an area in which the previous version of the erase table is stored.

17. The memory card according to claim 16,
wherein said erase table is disposed so as to be divided into a plurality of memory areas each of which assigned to different erase units,
wherein a first erase table is referred to when a first memory area to which rewrite data is written is determined,
wherein a second erase table is held a free-space information flag according to a second memory area in which data to be rewritten,
wherein said first erase table is formed in a memory area having a first erase unit different from a second erase unit of the second erase table, and
wherein the second memory area is determined with reference to the address translation table.

* * * * *